(12) United States Patent
Mui

(10) Patent No.: US 8,354,894 B2
(45) Date of Patent: Jan. 15, 2013

(54) RF SIGNAL COMBINER/SPLITTER AND RELATED METHODS

(75) Inventor: Andrew Mui, Rochester, NY (US)

(73) Assignee: Harris Corporation, Melbourne, FL (US)

( * ) Notice: Subject to any disclaimer, the term of this patent is extended or adjusted under 35 U.S.C. 154(b) by 253 days.

(21) Appl. No.: 12/433,218

(22) Filed: Apr. 30, 2009

(65) Prior Publication Data

US 2010/0277253 A1 Nov. 4, 2010

(51) Int. Cl.
 *H03H 7/38* (2006.01)
(52) U.S. Cl. ......... 333/131; 333/124; 333/129; 333/132
(58) Field of Classification Search .......... 333/124–129, 333/131, 132, 134
See application file for complete search history.

(56) References Cited

U.S. PATENT DOCUMENTS

| | | | | |
|---|---|---|---|---|
| 3,428,920 A | | 2/1969 | Oleksiak | ......................... 333/8 |
| 4,012,703 A | * | 3/1977 | Chamberlayne | ............ 333/24 R |
| 4,201,965 A | | 5/1980 | Onyshkevych | ............... 336/180 |
| 4,386,324 A | | 5/1983 | Schellenberg | ............... 330/277 |
| 4,463,326 A | | 7/1984 | Hom | ............... 333/128 |
| 4,647,868 A | | 3/1987 | Mueller | ....................... 330/286 |
| 4,817,189 A | * | 3/1989 | Pfizenmaier et al. | ......... 375/258 |
| 4,839,616 A | | 6/1989 | Herzog | |
| 5,334,957 A | | 8/1994 | Koontz | ............... 333/131 |
| 5,353,001 A | * | 10/1994 | Meinel et al. | .................... 336/83 |
| 5,598,327 A | | 1/1997 | Somerville et al. | |
| 5,949,321 A | | 9/1999 | Grandmont et al. | |
| 6,049,258 A | * | 4/2000 | Fawal et al. | .................... 333/177 |
| 6,069,548 A | | 5/2000 | Baarman et al. | |
| 6,750,752 B2 | | 6/2004 | Werlau | .......................... 336/229 |
| 6,888,438 B2 | | 5/2005 | Hui et al. | |
| 7,164,903 B1 | | 1/2007 | Cliff et al. | ..................... 455/327 |
| 7,477,114 B2 | * | 1/2009 | Pivit et al. | ..................... 333/112 |
| 2002/0070835 A1 | | 6/2002 | Dadafshar | |
| 2002/0070836 A1 | | 6/2002 | Fujiyoshi et al. | |
| 2002/0159214 A1 | | 10/2002 | Perlick et al. | |
| 2002/0170745 A1 | | 11/2002 | Opitz et al. | |
| 2003/0222738 A1 | | 12/2003 | Brown et al. | ................. 333/206 |
| 2004/0085176 A1 | | 5/2004 | Werlau | .......................... 336/229 |
| 2004/0113739 A1 | | 6/2004 | Du et al. | |
| 2004/0140862 A1 | | 7/2004 | Brown et al. | ................. 333/117 |
| 2004/0257190 A1 | | 12/2004 | Peck et al. | |
| 2008/0012680 A1 | | 1/2008 | Muelleman | |
| 2008/0079524 A1 | | 4/2008 | Suzuki | |
| 2008/0231403 A1 | | 9/2008 | Hsu | |

OTHER PUBLICATIONS

Anonymous, "Power Dividers/Combiners," M/A-Com Application Note M561, 1998; pp. 1015-1018.
Ellis, "The Magic Tee," Mike Ellis, 1999, pp. 1-4.

* cited by examiner

*Primary Examiner* — Robert Pascal
*Assistant Examiner* — Kimberly Glenn
(74) *Attorney, Agent, or Firm* — Allen, Dyer, Doppelt, Milbrath & Gilchrist, P.A.

(57) ABSTRACT

A radio frequency (RF) signal combiner/splitter may include a printed circuit board (PCB) having first and second opposing major surfaces, and openings therethrough. The RF signal combiner/splitter may further include a ferromagnetic body. The ferromagnetic body may include a first portion spaced from the first major surface of the PCB, a second portion spaced from the second major surface of the PCB, and interconnecting portions coupling the first and second portions and extending through respective openings in the PCB. The PCB may include conductive traces cooperating with the ferromagnetic body to define circuitry for combining/splitting RF signals. For example, the PCB may further comprise additional conductive traces cooperating with the ferromagnetic body to define impedance matching circuitry coupled to the circuitry for combining/splitting RF signals.

26 Claims, 8 Drawing Sheets

RF SIGNAL COMBINER/SPLITTER AND RELATED METHODS

FIELD OF THE INVENTION

The present invention relates to the field of radio frequency combiner/splitter circuits, and, more particularly, to toroidal radio frequency combiner/splitter circuits and related methods.

BACKGROUND OF THE INVENTION

Wireless communications devices are an integral part of society and permeate daily life. The typical wireless communications device includes an antenna, and a transceiver coupled to the antenna. The transceiver and the antenna cooperate to transmit and receive communications signals.

A typical radio frequency (RF) transceiver includes a power amplifier for amplifying low amplitude signals for transmission via the antenna. Given that most mobile communications devices operate on limited battery power, energy efficient power amplifiers may be desirable. More specifically and as will be appreciated by those skilled in the art, Class C and E power amplifiers are common in mobile communications devices since they are efficient power amplifiers. These classes of power amplifiers are more efficient than Class A or B amplifiers, for example, but are subject to performance tradeoffs. For example, they may be nonlinear over certain frequencies and may introduce greater amounts of distortion into the amplified signal (if the signal requires a linear amplifier).

In some communications applications, two or more smaller power amplifiers may be combined to provide a cumulative output without the incumbent complexity of a larger device. In other applications, a single amplifier may not be able to provide the needed performance in a practical implementation. This combination of two smaller amplifiers may be provided with a power RF combiner circuit. The "Wilkinson" type combiner is a typical RF combiner circuit with a number of input ports, for example, as disclosed in U.S. Pat. No. 3,091,743 to Wilkinson. The "Wilkinson" type power combiner may obtain input port-to-port isolation for each port by feeding each of the other ports with the signal applied to any one port through resistors with a 180 degree phase shifted voltage, with one-quarter wavelength transmission lines providing the 180 degree phase shift required for cancellation. For high frequency (HF) applications, i.e. 2 to 30 MHz, the physical length of the one-quarter wavelength transmission lines becomes impractical for many applications.

An approach to this drawback of "Wilkinson" type power combiners in HF applications may include using ferrite transformers instead of the one-quarter wavelength transmission lines, for example, as disclosed in U.S. Pat. No. 3,428,920 to Oleksiak. Referring to FIGS. 1-2, another such power combiner 20 is shown. This wound-wire type toroidal power combiner 20 illustratively includes a circuit board 23, a 100-Ohm bridging resistor 24 installed on the circuit board for dissipating any power mismatch in input power supplies 31-32 (50-Ohm input impedance), and three toroidal transformers 25a-25c installed on the circuit board and defining a power combiner circuit. Each toroidal transformer 25a-25c illustratively includes a ferrite core 22a-22c and Teflon coated windings 21a-21c surrounding the respective ferrite core. The wound-wire type power combiner 20 illustratively includes a 50-Ohm load resistor 27 coupled to the toroidal transformer 25c.

As will be appreciated by those skilled in the art, the Teflon coated windings 21a-21c are typically hand wound through the ferrite cores 22a-22c and are used for their desirable high breakdown voltage properties. Moreover, Teflon coated windings may be costly. This makes the manufacturer of such HF power combiners time consuming and expensive.

SUMMARY OF THE INVENTION

In view of the foregoing background, it is therefore an object of the present invention to provide a radio frequency (RF) combiner/splitter that is more effective and more easily manufactured.

This and other objects, features, and advantages in accordance with the present invention are provided by a RF signal combiner/splitter comprising a printed circuit board (PCB) having first and second opposing major surfaces, and a plurality of openings therethrough. The RF signal combiner/splitter also includes a ferromagnetic body comprising a first portion spaced from the first major surface of the PCB, a second portion spaced from the second major surface of the PCB, and a plurality of interconnecting portions coupling the first and second portions and extending through respective openings in the PCB. The PCB may include conductive traces cooperating with the ferromagnetic body to define circuitry, for example, operable over a frequency range of 2 to 30 MHz, for combining/splitting RF signals. Advantageously, the toroidal RF signal combiner/splitter may be manufactured without cumbersome wire windings.

More specifically, the circuitry for combining/splitting RF signals may comprise a plurality of summing toroidal inductors. The PCB may further comprise additional conductive traces cooperating with the ferromagnetic body to define impedance matching circuitry coupled to the circuitry for combining/splitting RF signals. Furthermore, the impedance matching circuitry may comprise a plurality of transformer toroidal inductors.

In some embodiments, the RF signal combiner/splitter may further comprise a plurality of RF signal ports coupled to the conductive traces. The ferromagnetic body may also comprise a plurality of joined together segments. Furthermore, the RF signal combiner/splitter may further comprise at least one load resistor coupled to the conductive traces. For example, the PCB may comprise at least one planar dielectric layer.

Another aspect is directed to a method of making a radio frequency (RF) signal combiner/splitter. The method may include providing a printed circuit board (PCB) having first and second opposing major surfaces, and a plurality of openings therethrough. The method also includes positioning a ferromagnetic body comprising a first portion spaced from the first major surface of the PCB, a second portion spaced from the second major surface of the PCB, and a plurality of interconnecting portions coupling the first and second portions and extending through respective openings in the PCB. The PCB may comprise conductive traces cooperating with the ferromagnetic body to define circuitry for combining/splitting RF signals.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Referring initially to FIGS. 3-7, a radio frequency (RF) signal combiner/splitter 40 is now described. As will be appreciated by those skilled in the art, the RF signal combiner/splitter 40 may be used as a combiner or a splitter depending on the direction of the signals. The RF signal combiner/splitter 40 illustratively includes a printed circuit board (PCB) 41. The PCB 41 has first 49 and second 51 opposing major surfaces and may include at least one planar dielectric layer and/or a ground plane. The PCB 41 also illustratively includes a plurality of openings 55a-55e therethrough. The openings 55a-55e are illustratively rectangle-shaped, but may have other shapes, for example, circular or N-sided polygonal shapes.

Figure 1:
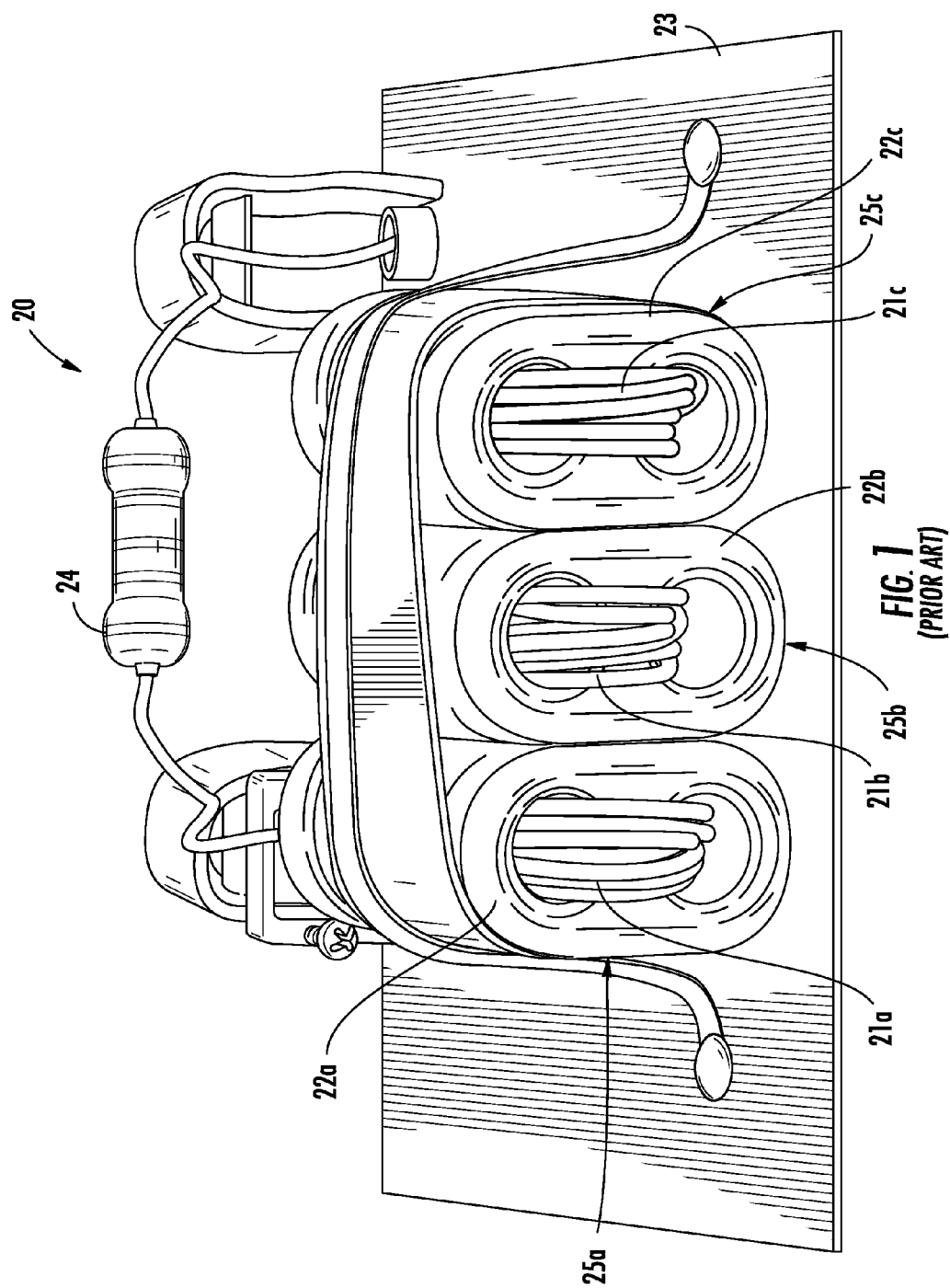
FIG. 1 is a perspective view of a toroidal signal combiner/splitter according to the prior art.
Figure 2:
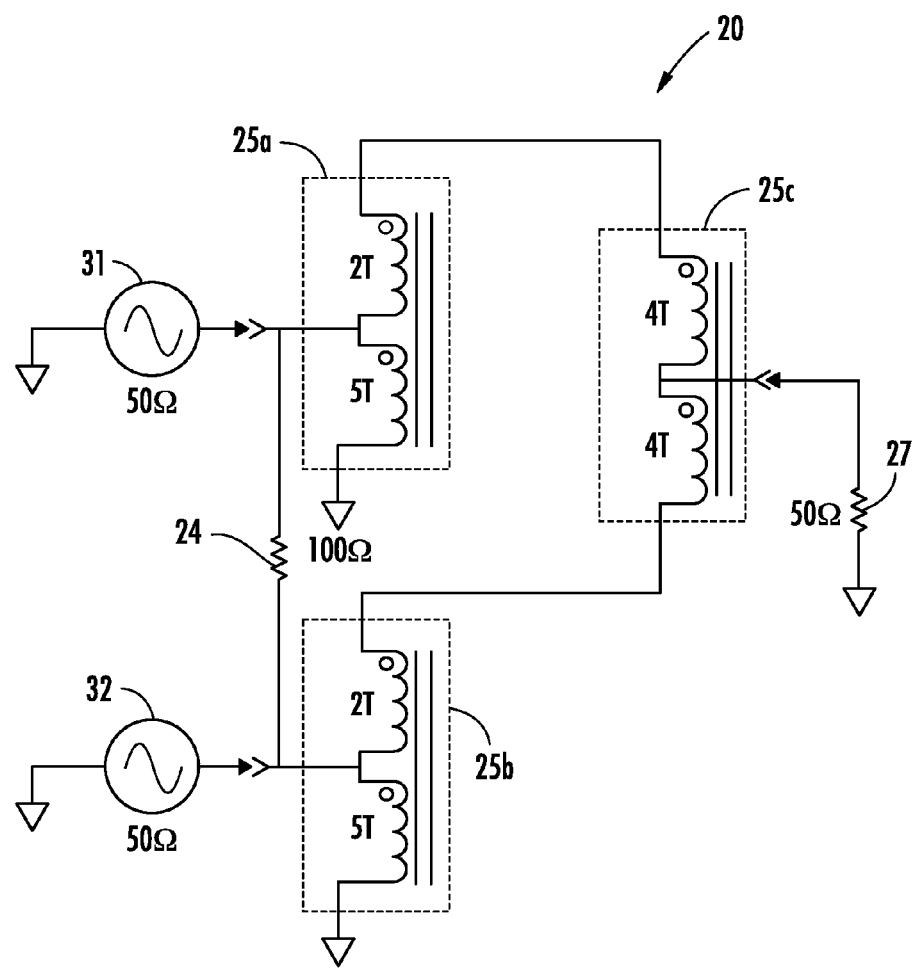
FIG. 2 is a schematic circuit diagram of the signal combiner/splitter of FIG. 1.
Figure 3:
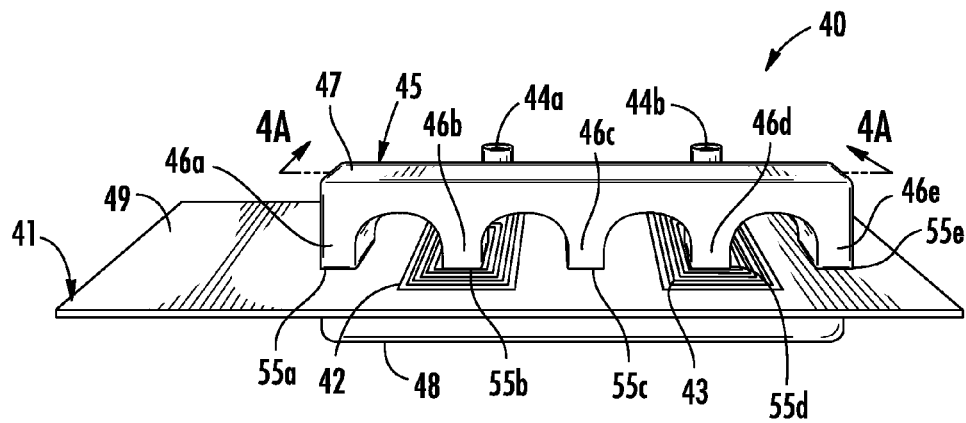
FIG. 3 is a side elevational view of a RF signal combiner/splitter according to the present invention.
Figure 4A:
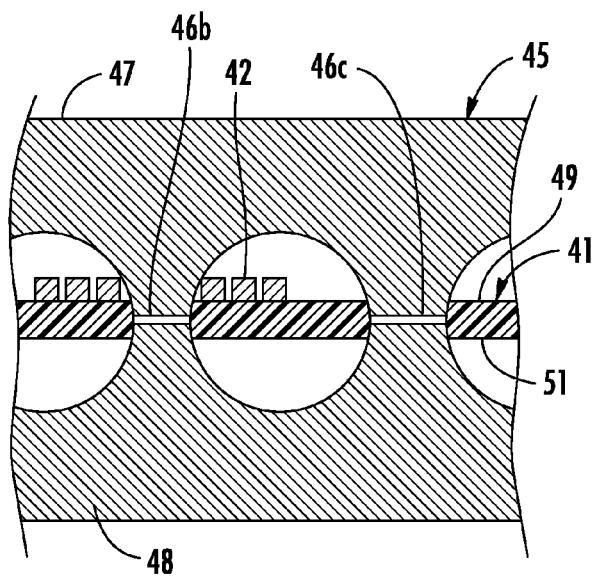
FIG. 4a is a cross-sectional view taken along lines 2-2 of the RF signal combiner/splitter of FIG. 3.
Figure 4B:
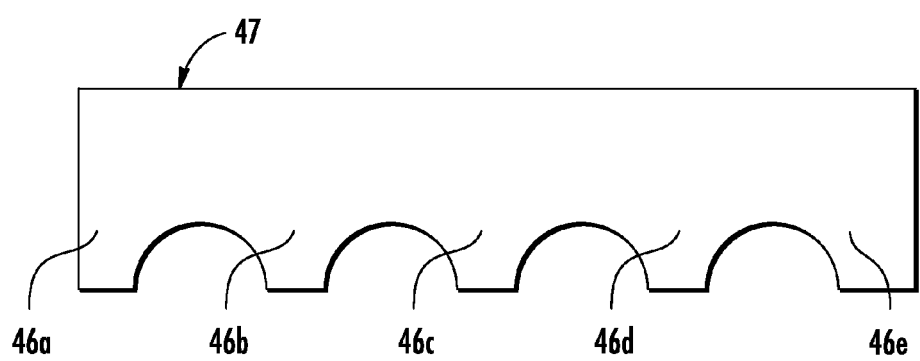
FIG. 4b is a side view of the top portion of the ferromagnetic body of the signal combiner/splitter FIG. 3.
Figure 5:
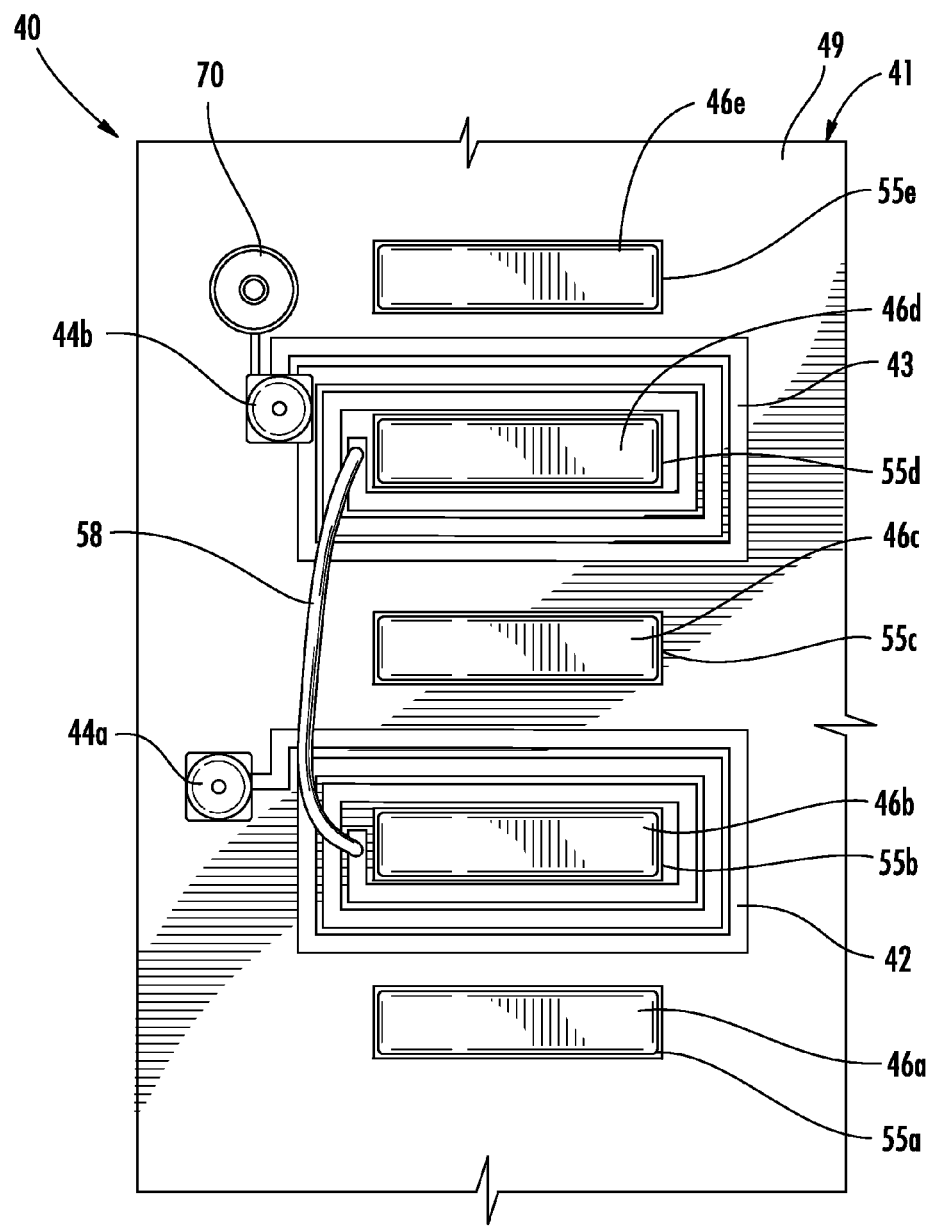
FIG. 5 is a plane topside view of the signal combiner/splitter of FIG. 3 with the top portion of the ferromagnetic body removed.
Figure 6:
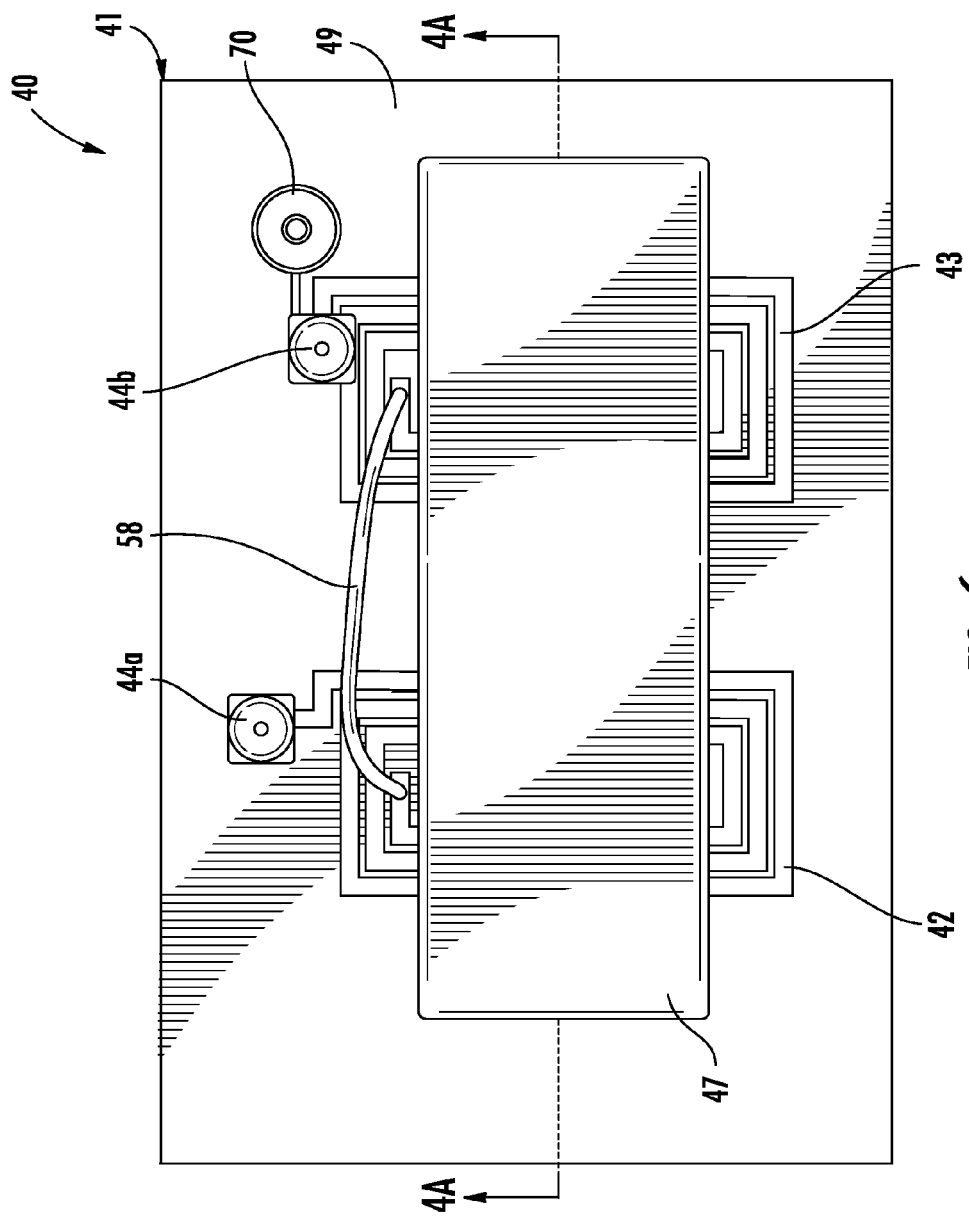
FIG. 6 is a plane topside view of the RF signal combiner/splitter of FIG. 3.
Figure 7:
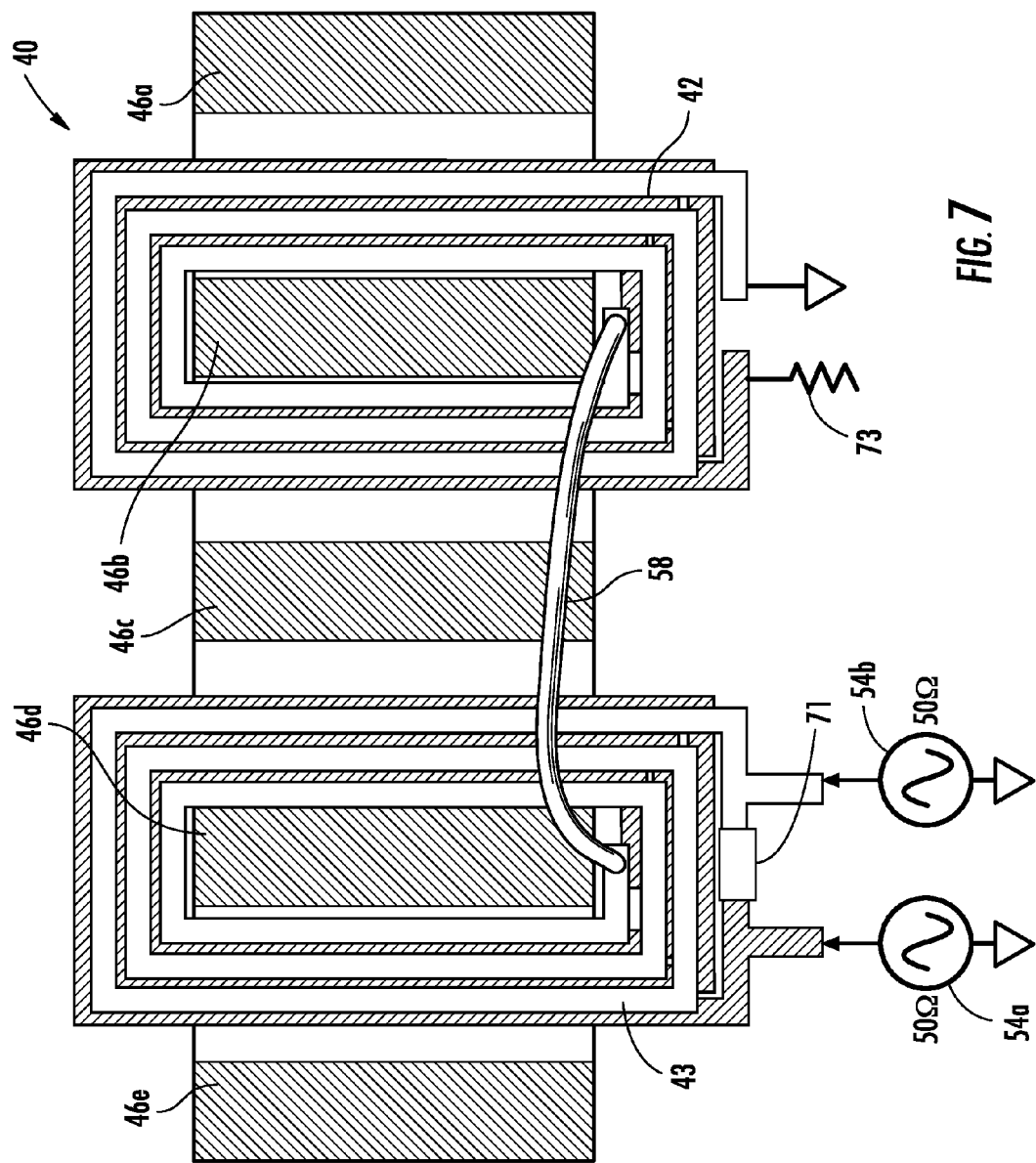
FIG. 7 is a pseudo schematic cross-sectional view taken along lines 3-3 of the RF signal combiner/splitter of FIG. 3.

The RF signal combiner/splitter 40 illustratively includes a ferromagnetic body 45 coupled through the PCB 41. The ferromagnetic body 45 may comprise ferrite, for example, and illustratively includes a first portion 47 spaced from the first major surface 49 of the PCB 41 and a second portion 48 spaced from the second major surface 51 of the PCB. The ferromagnetic body 45 also illustratively includes a plurality of interconnecting portions 46a-46e coupling the first 47 and second 48 portions and extending through respective openings 55a-55e in the PCB 41. Perhaps as best seen in FIGS. 4b and 5, the ferromagnetic body 45 may also comprise a plurality of joined together segments 47-48. In these embodiments, the first 47 and second 48 portions of the ferromagnetic body 45 may be joined together with ferrite adhesive, for example. In other embodiments, the ferromagnetic body may also comprise an integrally formed monolithic block, i.e. one piece.

As perhaps best seen in FIG. 5, the PCB 41 illustratively includes conductive traces 42-43 formed on the first major surface 49. The conductive traces 42-43 may comprise copper or aluminum, for example. The conductive traces 42-43 cooperate with the ferromagnetic body 45 to define circuitry for combining/splitting RF signals. The RF signal combiner/splitter 40 illustratively includes a plurality of RF signal ports 44a-44b coupled to the conductive traces 42-43.

Figure 8:
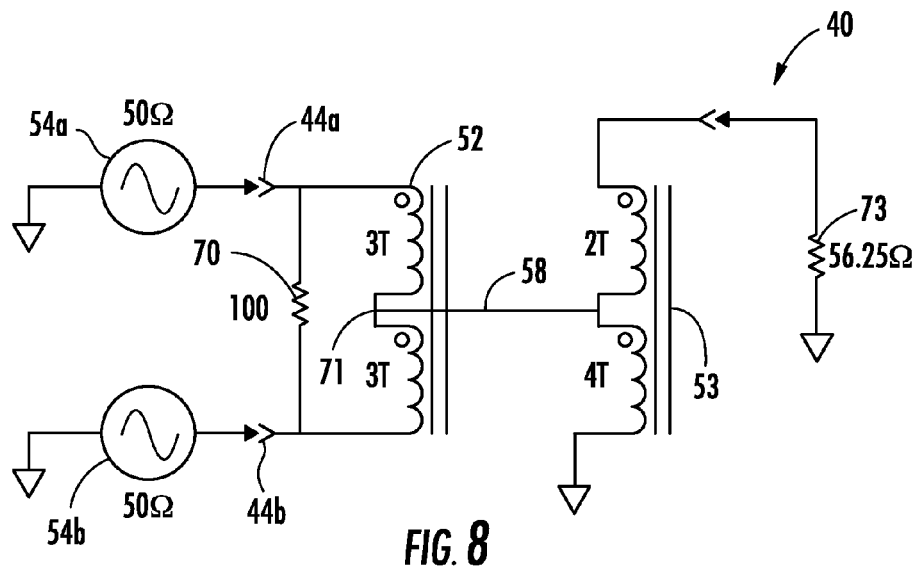
FIG. 8 is a schematic circuit diagram of the RF signal combiner/splitter of FIG. 3.

Referring briefly and additionally to FIG. 8, the circuitry of the RF signal combiner/splitter 40 illustratively includes a pair of radio frequency signal sources 54a-54b (50-Ohm input impedance) coupled to the RF signal ports 44a-44b, a 100-Ohm bridging resistor 70 coupled therebetween and for dissipating any power differential in the radio frequency signal sources, and a first set 52 of summing (combiner) toroidal inductors, i.e. coupled toroidal inductors, (2-three turn inductors), formed from the conductive traces and the ferromagnetic body, for combining the input power supplies. The circuitry of the RF signal combiner/splitter 40 also illustratively includes a second set 53 of transformer toroidal inductors (1-two turn inductor and 1-four turn inductor, i.e. 4T:6T auto transformer 1:2.25 Z(impedance)-ratio) for providing a step-up impedance transformer, and a 56.25 load impedance 73 also coupled to the conductive traces 42-43. As will be appreciated by those skilled in the art, the ideal load impedance would a 50-Ohm load; nonetheless, the illustrated embodiment includes a near ideal 56.25-Ohm load impedance 73.

The RF signal combiner/splitter 40 illustratively includes a center tap wire 58 coupling the first set 52 of summing toroidal inductors to the second set 53 of transformer toroidal inductors. In other embodiments, the center tap wire 58 may alternatively be formed on the first major surface 49 of the PCB 41 as a conductive trace.

As will be appreciated by those skilled in the art, this 56.25-Ohm output impedance 51 is provided by the second set 53 of transformer toroidal inductors, i.e. a 36/16 conversion ratio (25-Ohm*36/16=56.25-Ohm). More particularly, at point 71, the impedance of the circuit is 25-Ohm. The circuitry of the RF signal combiner/splitter 40 is operable over a frequency range of, for example, 2 to 30 MHz for combining/splitting RF signals, i.e. high frequency signals.

Figure 9:
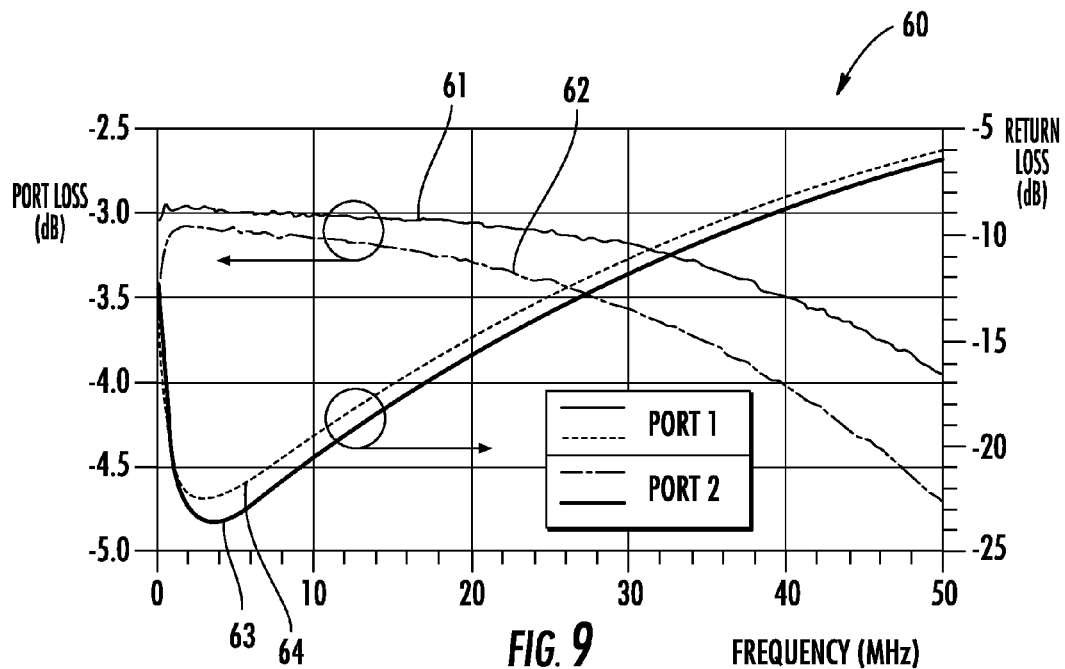
FIG. 9 is a chart of the electrical characteristics of the RF signal combiner/splitter in FIG. 3.

Referring additionally to FIG. 9, a chart 60 illustrates the electrical performance of the RF signal combiner/splitter 40. More particularly, the left-side y-axis represents port loss in decibels and the x-axis represents frequency in MHz. The right-side y-axis represents port return loss in decibels. In this test result, the RF signal combiner/splitter 40 is operated as a splitter, i.e. a single power source is fed into the output of the second set 53 of transformer toroidal inductors and two split signals are provided at the RF signal ports 44a-44b. As will be appreciated by those skilled in the art, the ideal splitter would receive input signal x(t) and output two split signals equaling 0.5*x(t), i.e. a power reduction of 3 decibels. Curves 61-62 demonstrate the near ideal performance (approximately −3 decibels) of the RF signal combiner/splitter 40 in the HE range, i.e. 2-30 MHz. Curves 63-64 demonstrate the near ideal return loss performance of the RF signal combiner/splitter 40 in the HF range, i.e. 2-30 MHz.

Advantageously, the above described RF signal combiner/splitter 40 is toroidal and well suited for HF applications yet may be manufactured without cumbersome hand wound wire coils. In other words, the RF signal combiner/splitter 40 may be manufactured without intensive manual labor. Indeed, the RF signal combiner/splitter 40 uses no soldering for assembly and may be manufactured before any wave soldering is used. Helpfully, the REF signal combiner/splitter 40 uses no external assemblies and is more mechanically robust than the typical wound-wire type power combiner. Moreover, the RF signal combiner/splitter 40 is readily manufactured with repeatable and consistent performance since the manual manufacture component of the typical power combiner is removed. Also, since the RF signal combiner/splitter 40 does not use expensive Teflon coated windings, the cost of manufacture is reduced.

Another aspect is directed to a method of making a RF signal combiner/splitter 40. The method may include providing a PCB 41 having first 49 and second 51 opposing major surfaces, and a plurality of openings 55a-55e therethrough. The method also includes positioning a ferromagnetic body 45 comprising a first portion 47 spaced from the first major surface 49 of the PCB 41, a second portion 48 spaced from the second major surface 51 of the PCB, and a plurality of interconnecting portions 46a-46e coupling the first and second portions and extending through respective openings 55a-55e in the PCB. The PCB 41 may comprise conductive traces 42-43 cooperating with the ferromagnetic body 45 to define circuitry for combining/splitting REF signals.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A radio frequency (RF) signal combiner/splitter comprising:
   a printed circuit board (PCB) having first and second opposing major surfaces, and a plurality of openings therethrough; and
   a ferromagnetic body comprising a first portion spaced from the first major surface of said PCB, a second portion spaced from the second major surface of said PCB, and a plurality of interconnecting portions coupling said first and second portions and extending through respective openings in said PCB;
   said PCB comprising a substrate and conductive traces thereon in a laterally extending spiral pattern on said substrate and cooperating with said ferromagnetic body to define circuitry for combining/splitting RF signals, said circuitry for combining/splitting RF signals comprising a plurality of summing toroidal inductors based upon said ferromagnetic body and said conductive traces.

2. The RF signal combiner/splitter according to claim 1 wherein said PCB further comprises additional conductive traces cooperating with said ferromagnetic body to define impedance matching circuitry coupled to said circuitry for combining/splitting RF signals.

3. The RF signal combiner/splitter according to claim 2 wherein said impedance matching circuitry comprises a plurality of transformer toroidal inductors based upon said ferromagnetic body and said additional conductive traces.

4. The RF signal combiner/splitter according to claim 1 further comprising a plurality of RF signal ports coupled to said conductive traces.

5. The RF signal combiner/splitter according to claim 1 wherein said ferromagnetic body comprises a plurality of joined together segments.

6. The RF signal combiner/splitter according to claim 1 further comprising at least one load resistor coupled to said conductive traces.

7. The RF signal combiner/splitter according to claim 1 wherein said substrate comprises at least one planar dielectric layer.

8. A radio frequency (RF) signal combiner/splitter comprising:
   a printed circuit board (PCB) having first and second opposing major surfaces, and a plurality of openings therethrough; and
   a ferromagnetic body comprising a first portion spaced from the first major surface of said PCB, a second portion spaced from the second major surface of said PCB, and a plurality of interconnecting portions coupling said first and second portions and extending through respective openings in said PCB;
   said PCB comprising a substrate and conductive traces thereon in a laterally extending spiral pattern on said substrate and cooperating with said ferromagnetic body to define circuitry for combining/splitting RF signals over a frequency range of 2 to 30 MHz and comprising a plurality of summing toroidal inductors based upon said ferromagnetic body and said conductive traces.

9. The RF signal combiner/splitter according to claim 8 wherein said PCB further comprises additional conductive traces cooperating with said ferromagnetic body to define impedance matching circuitry coupled to said circuitry for combining/splitting RF signals.

10. The RF signal combiner/splitter according to claim 9 wherein said impedance matching circuitry comprises a plurality of transformer toroidal inductors based upon said ferromagnetic body and said additional conductive traces.

11. The RF signal combiner/splitter according to claim 8 further comprising a plurality of RF signal ports coupled to said conductive traces.

12. The RF signal combiner/splitter according to claim 8 wherein said ferromagnetic body comprises a plurality of joined together segments.

13. A method of making a radio frequency (RF) signal combiner/splitter, the method comprising:
   providing a printed circuit board (PCB) having first and second opposing major surfaces, and a plurality of openings therethrough; and
   positioning a ferromagnetic body comprising a first portion spaced from the first major surface of the PCB, a second portion spaced from the second major surface of the PCB, and a plurality of interconnecting portions coupling the first and second portions and extending through respective openings in the PCB;
   the PCB comprising a substrate and conductive traces thereon in a laterally extending spiral pattern on the substrate and cooperating with the ferromagnetic body to define circuitry for combining/splitting RF signals, the circuitry for combining/splitting RF signals comprising a plurality of summing toroidal inductors based upon the ferromagnetic body and the conductive traces.

14. The method according to claim 13 further comprising providing the PCB having additional conductive traces cooperating with the ferromagnetic body to define impedance matching circuitry coupled to the circuitry for combining/splitting RF signals.

15. The method according to claim 13 further comprising coupling a plurality of RF signal ports to the conductive traces.

16. A radio frequency (RF) signal combiner/splitter comprising:
   a printed circuit board (PCB) having first and second opposing major surfaces, and a plurality of openings therethrough; and
   a ferromagnetic body comprising a first portion spaced from the first major surface of said PCB, a second portion spaced from the second major surface of said PCB, and a plurality of interconnecting portions coupling said first and second portions and extending through respective openings in said PCB;
   said PCB comprising conductive traces cooperating with said ferromagnetic body to define circuitry for combining/splitting RF signals and additional conductive traces cooperating with said ferromagnetic body to define impedance matching circuitry coupled to said circuitry for combining/splitting RF signals.

17. A radio frequency (RF) signal combiner/splitter comprising:
a printed circuit board (PCB) having first and second opposing major surfaces, and a plurality of openings therethrough; and
a ferromagnetic body comprising a first portion spaced from the first major surface of said PCB, a second portion spaced from the second major surface of said PCB, and a plurality of interconnecting portions coupling said first and second portions and extending through respective openings in said PCB;
said PCB comprising
a substrate,
conductive traces thereon in a laterally extending spiral pattern on said substrate and cooperating with said ferromagnetic body to define circuitry for combining/splitting RF signals, and
additional conductive traces cooperating with said ferromagnetic body to define impedance matching circuitry coupled to said circuitry for combining/splitting RF signals.

18. The RF signal combiner/splitter according to claim 17 further comprising a plurality of RF signal ports coupled to said conductive traces.

19. The RF signal combiner/splitter according to claim 17 wherein said ferromagnetic body comprises a plurality of joined together segments.

20. A radio frequency (RF) signal combiner/splitter comprising:
a printed circuit board (PCB) having first and second opposing major surfaces, and a plurality of openings therethrough;
a ferromagnetic body comprising a first portion spaced from the first major surface of said PCB, a second portion spaced from the second major surface of said PCB, and a plurality of interconnecting portions coupling said first and second portions and extending through respective openings in said PCB;
said PCB comprising
a substrate,
conductive traces thereon in a laterally extending spiral pattern on said substrate and cooperating with said ferromagnetic body to define circuitry for combining/splitting RF signals and being operable over a frequency range of 2 to 30 MHz, and
additional conductive traces cooperating with said ferromagnetic body to define impedance matching circuitry coupled to said circuitry for combining/splitting RF signals, said circuitry for combining/splitting RF signals comprising a plurality of summing toroidal inductors based upon said ferromagnetic body and said conductive traces; and
at least one load resistor coupled to said conductive traces.

21. The RF signal combiner/splitter according to claim 20 further comprising a plurality of RF signal ports coupled to said conductive traces.

22. The RF signal combiner/splitter according to claim 20 wherein said ferromagnetic body comprises a plurality of joined together segments.

23. A method of making a radio frequency (RF) signal combiner/splitter, the method comprising:
providing a printed circuit board (PCB) having first and second opposing major surfaces, and a plurality of openings therethrough;
positioning a ferromagnetic body comprising a first portion spaced from the first major surface of the PCB, a second portion spaced from the second major surface of the PCB, and a plurality of interconnecting portions coupling the first and second portions and extending through respective openings in the PCB;
the PCB comprising a substrate and conductive traces thereon in a laterally extending spiral pattern on the substrate and cooperating with the ferromagnetic body to define circuitry for combining/splitting RF signals; and
providing the PCB having additional conductive traces cooperating with the ferromagnetic body to define impedance matching circuitry coupled to the circuitry for combining/splitting RF signals.

24. The method according to claim 23 further comprising coupling a plurality of RF signal ports to the conductive traces.

25. A method of making a radio frequency (RF) signal combiner/splitter, the method comprising:
providing a printed circuit board (PCB) having first and second opposing major surfaces, and a plurality of openings therethrough; and
positioning a ferromagnetic body comprising a first portion spaced from the first major surface of the PCB, a second portion spaced from the second major surface of the PCB, and a plurality of interconnecting portions coupling the first and second portions and extending through respective openings in the PCB;
the PCB comprising a substrate and conductive traces thereon in a laterally extending spiral pattern on the substrate and cooperating with the ferromagnetic body to define circuitry for combining/splitting RF signals and being operable over a frequency range of 2 to 30 MHz, the circuitry for combining/splitting RF signals comprising a plurality of summing toroidal inductors based upon the ferromagnetic body and the conductive traces.

26. The method according to claim 25 further comprising coupling a plurality of RF signal ports to the conductive traces.

* * * * *